(12) United States Patent
Iwakoshi et al.

(10) Patent No.: US 10,178,774 B2
(45) Date of Patent: Jan. 8, 2019

(54) CERAMIC ELECTRONIC COMPONENT AND MANUFACTURING METHOD THEREOF

(71) Applicant: Murata Manufacturing Co., Ltd., Nagaokakyo-shi, Kyoto-fu (JP)

(72) Inventors: Kunio Iwakoshi, Nagaokakyo (JP); Syuichi Onodera, Nagaokakyo (JP); Takao Okano, Nagaokakyo (JP); Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 167 days.

(21) Appl. No.: 14/068,053

(22) Filed: Oct. 31, 2013

(65) Prior Publication Data
US 2014/0057080 A1 Feb. 27, 2014

Related U.S. Application Data

(63) Continuation of application No. PCT/JP2012/061364, filed on Apr. 27, 2012.

(30) Foreign Application Priority Data

May 16, 2011 (JP) ................................ 2011-109121

(51) Int. Cl.
*B32B 3/30* (2006.01)
*H05K 3/00* (2006.01)
(Continued)

(52) U.S. Cl.
CPC ....... *H05K 3/0091* (2013.01); *H01L 21/4853* (2013.01); *H01L 23/15* (2013.01);
(Continued)

(58) Field of Classification Search
CPC .. H05K 1/0213; H05K 1/0284; H05K 1/0296; H05K 1/0298; H05K 1/115;
(Continued)

(56) References Cited

U.S. PATENT DOCUMENTS 5,549,778 A * 8/1996 Yokoyama et al. .......... 156/246
5,731,066 A 3/1998 Ando et al.
(Continued)

FOREIGN PATENT DOCUMENTS

JP 08-058259 A 3/1996
JP 08-064932 A 3/1996
(Continued)

OTHER PUBLICATIONS

Machine translation of WO 2008/053956 Murata obtained from EPO on Aug. 5, 2015.*
(Continued)

*Primary Examiner* — Megha M Gaitonde
(74) *Attorney, Agent, or Firm* — Keating & Bennett, LLP

(57) ABSTRACT

In an electronic component, a peripheral portion of an external terminal electrode is thicker than a center portion thereof, and at least a portion of the peripheral portion is buried in a component main body. A surface of the external terminal electrode and a principal surface of the component main body are located on the same plane. An electrically insulating coating layer is arranged along the principal surface of the component main body so as to cover at least a portion of the peripheral portion of the external terminal electrode. An end portion of the coating layer is in contact with a thickest portion of the peripheral portion of the external terminal electrode in the principal surface of the component main body. The coating layer and the surface of the external terminal electrode are located on the same plane.

8 Claims, 7 Drawing Sheets

(51) Int. Cl.
- *H01L 23/498* (2006.01)
- *H05K 3/40* (2006.01)
- *H01L 23/15* (2006.01)
- *H01L 21/48* (2006.01)
- *H05K 1/11* (2006.01)
- *H05K 3/38* (2006.01)
- *H05K 3/46* (2006.01)
- *H05K 3/12* (2006.01)
- *H05K 3/24* (2006.01)

(52) U.S. Cl.
CPC .. *H01L 23/49811* (2013.01); *H01L 23/49822* (2013.01); *H05K 3/4007* (2013.01); *H01L 23/49827* (2013.01); *H01L 2924/0002* (2013.01); *H05K 1/111* (2013.01); *H05K 3/1216* (2013.01); *H05K 3/246* (2013.01); *H05K 3/38* (2013.01); *H05K 3/4629* (2013.01); *H05K 2203/0278* (2013.01); *H05K 2203/0545* (2013.01); *H05K 2203/1476* (2013.01); *Y10T 428/24488* (2015.01)

(58) Field of Classification Search
CPC ........ H05K 1/116; H05K 1/119; H05K 1/181; B32B 3/06; B32B 15/00; B23K 31/02; H01L 23/4824; H01L 23/4821; Y10T 428/24355; Y10T 428/24479; Y10T 428/24488; Y10T 428/24521; Y10T 428/24545; Y10T 428/24612; Y10T 428/24802; Y10T 428/24917; Y10T 428/24942; Y10T 428/2495; Y10T 428/24959

USPC .... 428/156, 157, 161, 164, 172, 195.1, 209, 428/212, 213, 214; 174/250, 257, 260, 174/261, 263; 228/178, 179.1, 182, 189
See application file for complete search history.

(56) References Cited

U.S. PATENT DOCUMENTS

| | | | |
|---|---|---|---|
| 7,388,296 | B2 * | 6/2008 | Urashima ............... H01L 23/15 174/257 |
| 2004/0022043 | A1 * | 2/2004 | Sakai ................ H01L 23/49822 361/795 |

FOREIGN PATENT DOCUMENTS

| | | |
|---|---|---|
| JP | 8-125341 A | 5/1996 |
| JP | 2001-267744 A | 9/2001 |
| JP | 2004-221407 A | 8/2004 |
| JP | 2006-335045 A | 12/2006 |
| JP | 3994936 B2 | 10/2007 |
| WO | 2008/053956 A1 | 5/2008 |

OTHER PUBLICATIONS

Written translation of WO 2008/053956 Murata, May 8, 2005.*
Official Communication issued in International Patent Application No. PCT/JP2012/061364, dated Jun. 12, 2012.

* cited by examiner

CERAMIC ELECTRONIC COMPONENT AND MANUFACTURING METHOD THEREOF

BACKGROUND OF THE INVENTION

1. Field of the Invention

The present invention relates to a ceramic electronic component and a manufacturing method thereof, and particularly relates to a structure and a forming method of an external terminal electrode provided in a ceramic electronic component.

2. Description of the Related Art

As a ceramic electronic component that is relevant to the present invention, for example, there is a laminated ceramic electronic component described in Japanese Unexamined Patent Application Publication No. 2001-267744. The laminated ceramic electronic component described in Japanese Unexamined Patent Application Publication No. 2001-267744 is also referred to as a multilayer ceramic substrate and includes a component main body having a laminated structure composed of a plurality of ceramic layers.

The multilayer ceramic substrate is mounted on a predetermined mounting board, and is provided with an external terminal electrode which is electrically connected to the mounting board. In general, the external terminal electrode of the multilayer ceramic substrate is formed by printing a conductive paste on a ceramic green sheet located at an outermost layer by means of screen printing, laminating the ceramic green sheet at the outermost layer together with other ceramic green sheets, pressing the ceramic green sheets, and then firing the ceramic green sheets. In addition, the fired external terminal electrode is subjected to nickel plating and gold plating or nickel plating and tin plating according to need in some cases.

However, when the external terminal electrode is formed by the above method, the following phenomena tend to occur.

In general, when the conductive paste is printed on the ceramic green sheet by means of screen printing, the conductive paste gathers at a center portion of a printed coating film due to surface tension of the conductive paste, and the thickness of the peripheral portion of the printed coating film is decreased.

In addition, the conductive paste adheres to and remains at the side surface of an opening in a transmission portion of a screen printing plate which transmission portion allows transmission of the conductive paste, and the thickness of the peripheral portion of a conductive paste film as the printed coating film is decreased.

Furthermore, in the pressing step, the conductive paste film is crushed in its thickness direction, and thus the conductive paste, in particular, the peripheral portion thereof, is decreased further.

As described above, when the thickness of the peripheral portion of the conductive paste film as the printed coating film is decreased, the thickness of the peripheral portion of the fired external terminal electrode is naturally decreased. However, stress that may cause peeling of the external terminal electrode is most likely to be applied to the peripheral portion. Thus, when the thickness of the peripheral portion of the external terminal electrode is decreased, the external terminal electrode easily peels off from the component main body, resulting in a problem that the bonding strength of the external terminal electrode is decreased. In addition, when plating is applied, a problem may also be caused that a plating solution infiltrates through the interface between the external terminal electrode and the component main body to further decrease the bonding strength.

As a measure to increase the thicknesses of the peripheral portion of the external terminal electrode, it is conceivable that printing of the conductive paste to form an external terminal electrode is repeatedly conducted, that is, the conductive paste is reapplied. However, when printing of the conductive paste is repeated by screen printing, as the thickness of the conductive paste film is increased, adhesiveness between the screen printing plate and the conductive paste film is deteriorated. Thus, the printability is deteriorated and the contour shape of the external terminal electrode is deteriorated. In addition, the repeated printing leads to a decrease of the productivity and an increase of the manufacturing cost.

Furthermore, in general, the conductive paste contains a sintering inhibitor such as alumina in order to increase a bonding strength with a ceramic material, and containing the sintering inhibitor increases a difference in shrinkage behavior between the external terminal electrode and the component main body in the firing step. Therefore, as the thickness of the external terminal electrode is increased, stress caused due to the above difference in shrinkage behavior is increased, and this stress may be applied to the component main body to cause undesirable deformation such as a warp and waviness in the component main body.

It should be noted that in addition to a laminated ceramic electronic component such as a multilayer ceramic substrate, the above problems may occur also in, for example, a ceramic electronic component having a non-laminated-type structure that includes a component main body composed of a single-layer ceramic substrate and in which an external terminal electrode is provided along a principal surface of the component main body.

SUMMARY OF THE INVENTION

Therefore, preferred embodiments of the present invention provide a ceramic electronic component having an increased bonding strength of an external terminal electrode and a manufacturing method thereof.

A ceramic electronic component according to a preferred embodiment of the present invention includes a component main body made of a ceramic material; and an external terminal electrode provided along a principal surface of the component main body, the ceramic electronic component being mounted on a mounting board with the external terminal electrode electrically connected to the mounting board. In order to solve the above-described technical problems, the external terminal electrode includes a peripheral portion and a center portion surrounded by the peripheral portion, a thickness of the peripheral portion is larger than a thickness of the center portion, and at least a portion of the peripheral portion is buried in the component main body. Thus, it is possible to improve a bonding strength of the external terminal electrode.

Preferably, a surface of the external terminal electrode and the principal surface of the component main body are located on the same plane. With this configuration, it is possible to further enhance the effect of improving the bonding strength of the external terminal electrode.

Preferably, an electrically insulating coating layer is arranged along the principal surface of the component main body so as to cover at least a portion of the peripheral portion of the external terminal electrode. Preferably, an end portion of the coating layer is in contact with a thickest portion of the peripheral portion of the external terminal electrode in the principal surface of the component main body. In addition, preferably, the coating layer and a surface of the external terminal electrode are located on the same plane. These configurations are able to contribute to further enhancement of the effect of improving the bonding strength of the external terminal electrode.

A plating film may be provided on a surface of the external terminal electrode. When the plating film is formed, a problem may arise that a plating solution infiltrates through the interface between the external terminal electrode and the component main body. With the configuration in which the external terminal electrode includes the peripheral portion and the center portion surrounded by the peripheral portion, the thickness of the peripheral portion is larger than the thickness of the center portion, and at least a portion of the peripheral portion is buried in the component main body as described above, it is possible to make infiltration of the plating solution less likely to occur. Thus, it is possible to make the problem of a decrease in the bonding strength of the external terminal electrode by infiltration of the plating solution less likely to occur.

In addition, the center portion and the peripheral portion of the external terminal electrode may have compositions that are different from each other.

Various preferred embodiments of the present invention may be directed to a laminated ceramic electronic component. In this case, the component main body preferably includes a plurality of laminated ceramic layers, and the ceramic electronic component further includes an internal conductor disposed within the component main body.

Another preferred embodiment of the present invention is directed to a manufacturing method of a ceramic electronic component.

A manufacturing method according to a preferred embodiment of the present invention includes a step of preparing a ceramic green sheet; a step of forming an external terminal electrode on a principal surface of the ceramic green sheet using a conductive paste; and a step of firing the ceramic green sheet on which the external terminal electrode has been formed. In order to solve the above-described technical problems, in the step of forming the external terminal electrode, the external terminal electrode is formed such that a thickness of a peripheral portion thereof is larger than a thickness of a center portion thereof surrounded by the peripheral portion. According to the manufacturing method, it is possible to produce a ceramic electronic component having a high bonding strength of an external terminal electrode.

Preferably, in forming the external terminal electrode, the peripheral portion and the center portion are separately formed. With this configuration, a phenomenon that the conductive paste gathers at the center portion by surface tension is suppressed or prevented. Thus, it is possible to easily increase the thickness of the peripheral portion. In addition, it is possible to advantageously avoid problems that may be caused in the case of reapplication, such as decrease in printability, decrease in productivity, and increase in manufacturing cost.

In the above preferred embodiment, a step of forming the center portion may be conducted after a step of forming the peripheral portion, or the step of forming the peripheral portion may be inversely conducted after the step of forming the center portion. In the case where the step of forming the center portion is conducted after the step of forming the peripheral portion as in the former, adhesiveness between a screen printing plate and the ceramic green sheet is not impaired by the center portion in printing the peripheral portion by screen printing. Thus, it is possible to obtain favorable printability. On the other hand, in the case where the step of forming the peripheral portion is conducted after the step of forming the center portion as in the latter, it is easy to form the center portion such that the center portion is thinner.

In addition, according to the above preferred embodiment, a composition of a conductive paste used in the step of forming the peripheral portion may be made different from a composition of a conductive paste used in the step of forming the center portion. For example, an amount of an inorganic material in the conductive paste used in the step of forming the peripheral portion is made larger than that in the conductive paste used in the step of forming the center portion, or an amount of an organic solvent in the conductive paste used in the step of forming the peripheral portion is made smaller than that in the conductive paste used in the step of forming the center portion.

In the case where the amount of the inorganic material in the conductive paste used in the step of forming the peripheral portion is made larger than that in the conductive paste used in the step of forming the center portion as in the former, the inorganic material is firmly bonded to a glass component included in the ceramic material in the ceramic green sheet by firing, and thus it is possible to improve a bonding strength particularly at the peripheral portion. Meanwhile, when the inorganic material is added to the conductive paste in a larger amount, a conductor film obtained by firing becomes less compact, and infiltration of water from the outside easily occurs. When the amount of the inorganic material is made relatively small in the conductive paste for forming the center portion, a compact conductor film is formed at the center portion. In particular, the center portion is formed so as to be relatively thin and may be connected to a via conductor within the component main body, and thus is preferably a compact conductor film.

In the case where the amount of the organic solvent in the conductive paste used in the step of forming the peripheral portion is made smaller than that in the conductive paste used in the step of forming the center portion as in the latter, it is made easy to print the peripheral portion such that the peripheral portion is thicker and it is made easy to print the center portion such that the center portion is thinner, which achieves even more advantageous results of the present invention.

Preferably, the step of pressing the ceramic green sheet on which the external terminal electrode has been formed is conducted before the above-described firing step. With this configuration, it is possible to further increase adhesiveness of the external terminal electrode with the component main body.

With the pressing step, preferably, at least a portion of the peripheral portion of the external terminal electrode is buried in the ceramic green sheet, and more preferably, a surface of the external terminal electrode is located on the same plane as the principal surface of the ceramic green sheet.

Preferably, before the firing step, an electrically insulating coating layer is formed on the ceramic green sheet so as to cover at least a portion of the peripheral portion of the external terminal electrode. The coating layer is preferably formed by applying an insulator paste by screen printing.

Particularly, when the center portion is formed after the peripheral portion is formed; and then the coating layer is formed by screen printing, since the peripheral portion is formed with favorable printability as described above, it is possible to make bleeding less likely to occur during screen printing of the coating layer. On the other hand, when the peripheral portion is formed after the center portion is formed; and then the coating layer is formed by screen printing, it is possible to form the center portion such that the center portion is thinner as described. Thus, it is easy to further increase the difference in thickness between the thicker peripheral portion and the thinner center portion, and it is possible to increase the adhesiveness between the peripheral portion and a screen printing plate for printing the coating layer. Therefore, it is possible to make bleeding less likely to occur during screen printing of the coating layer.

In addition, in the case where the electrically insulating coating layer is formed on the ceramic green sheet so as to cover at least a portion of the peripheral portion of the external terminal electrode as described above, a step of pressing the ceramic green sheet on which the external terminal electrode and the coating layer have been formed, such that a surface of the external terminal electrode and a surface of the coating layer are located on the same plane is preferably conducted before the firing step.

In the manufacturing method of the ceramic electronic component according to a preferred embodiment of the present invention may further include a step of forming a plating film on a surface of the external terminal electrode.

In the case where the manufacturing method according to a preferred embodiment of the present invention is directed to a manufacturing method of a laminated ceramic electronic component, a plurality of ceramic green sheets are prepared, the step of forming the external terminal electrode is conducted on a specific one of the plurality of ceramic green sheets, and a step of forming an internal conductor on a specific one of the plurality of ceramic green sheets and a step of laminating the plurality of ceramic green sheets such that the external terminal electrode is located on one principal surface are conducted.

According to various preferred embodiments of the present invention, in the external terminal electrode, the thickness of the peripheral portion to which stress that may cause peeling is easily applied is made larger than the thickness of the center portion, and thus it is possible to improve the bonding strength of the external terminal electrode. In addition, in the case where the plating film is provided on the external terminal electrode, infiltration of the plating solution through the interface between the external terminal electrode and the component main body is made less likely to occur. Therefore, it is possible to make decrease in the bonding strength of the external terminal electrode by infiltration of the plating solution less likely to occur.

In addition, as described above, the conductive paste in general contains a sintering inhibitor such as alumina in order to increase the bonding strength with a ceramic material. The sintering inhibitor tends to increase the difference in shrinkage behavior between the external terminal electrode and the component main body in the firing step. In various preferred embodiments of the present invention, the thickness of only the peripheral portion that more greatly influences the bonding strength of the external terminal electrode is increased, the thickness of the center portion is reduced, and thus it is possible to make undesirable deformation such as a warp and waviness in the component main body, which is caused due to the difference in the shrinkage behavior, less likely to occur.

When at least a portion of the peripheral portion of the external terminal electrode is buried in the component main body, it is possible to further enhance the above effect of improving the bonding strength and the above effect of suppressing infiltration of the plating solution.

According to the manufacturing method of the ceramic electronic component according to a preferred embodiment of the present invention, the external terminal electrode is formed such that the thickness of the peripheral portion is larger than the thickness of the center portion surrounded by the peripheral portion, and thus it is possible to produce a ceramic electronic component having a high bonding strength of an external terminal electrode.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B illustrate a first preferred embodiment of the present invention regarding a forming method of an external terminal electrode provided in the ceramic electronic component shown in FIG. 1, wherein FIG. 2A is a plan view showing a state where a peripheral portion is formed, and FIG. 2B is a cross-sectional view showing, together with a screen printing plate, the state where the peripheral portion is formed.

FIG. 3A is a plan view showing a state where a center portion is formed, and FIG. 3B is a cross-sectional view showing, together with a screen printing plate, the state where the center portion is formed.

FIGS. 7A and 7B illustrate a second preferred embodiment of the present invention regarding the forming method of the external terminal electrode provided in the ceramic electronic component shown in FIG. 1, wherein FIG. 7A is a plan view showing a state where a center portion is formed, and FIG. 7B is a cross-sectional view showing, together with a screen printing plate, the state where the center portion is formed.

FIGS. 8A and 8B illustrate a step conducted subsequent to a step shown in FIGS. 7A and 7B, wherein FIG. 8A is a plan view showing a state where a peripheral portion is formed, and FIG. 8B is a cross-sectional view showing, together with a screen printing plate, the state where the peripheral portion is formed.

DETAILED DESCRIPTION OF THE PREFERRED EMBODIMENTS

Figure 1:
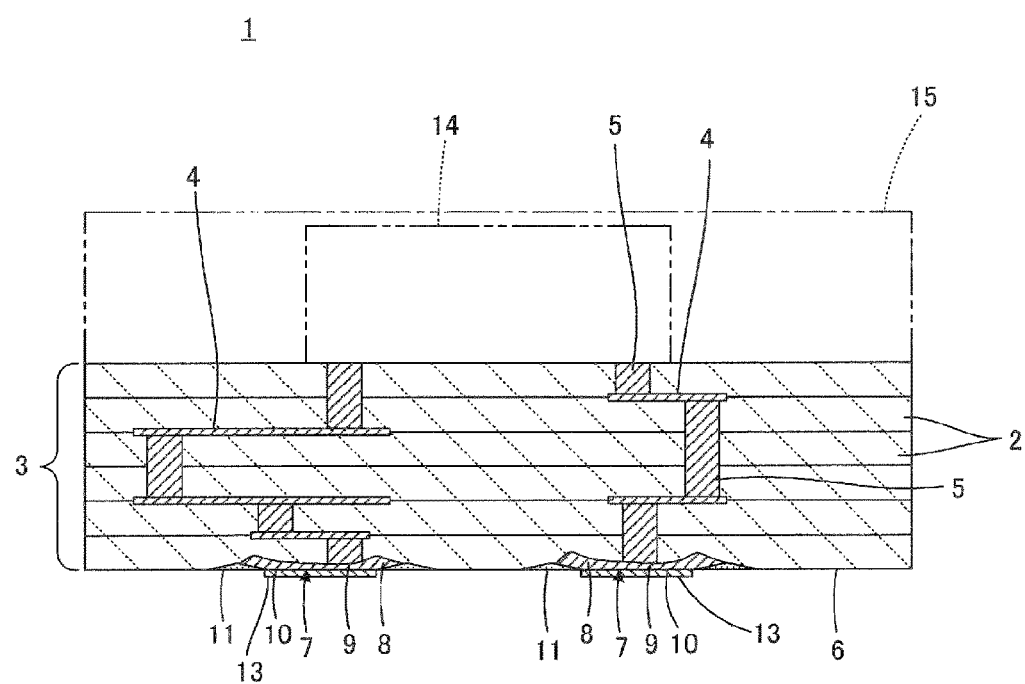
FIG. 1 is a cross-sectional view showing a ceramic electronic component according to a preferred embodiment of the present invention.

With reference to FIG. 1, a structure of a ceramic electronic component 1 according to a preferred embodiment of the present invention will be described.

The ceramic electronic component 1 constitutes a multilayer ceramic substrate and includes a component main body having a laminated structure including a plurality of laminated ceramic layers 2. Within the component main body 3, internal conductor films 4 are provided as internal conductors along specific interfaces between the ceramic layers 2, and via conductors 5 are provided so as to extend through specific ceramic layers 2.

The ceramic electronic component 1 also includes external terminal electrodes 7 provided along a principal surface 6 of the component main body 3. The ceramic electronic component 1 is mounted on a mounting board, which is not shown, such that the external terminal electrodes 7 are electrically connected to the mounting board and mechanically fixed to the mounting board.

Figure 6:
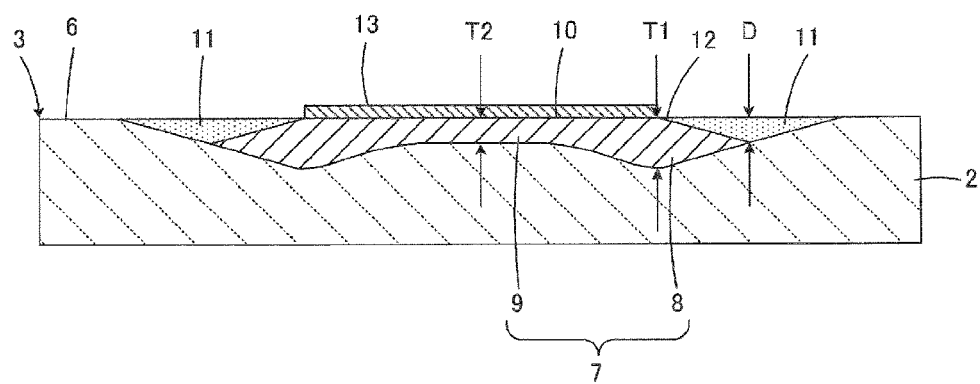
FIG. 6 illustrates a step conducted subsequent to the step shown in FIG. 5 and is a cross-sectional view showing a state where a plating film is formed on the external terminal electrode after a firing step.

The external terminal electrode 7 is shown in FIG. 6 in an enlarged manner. It should be noted that FIG. 6 shows the external terminal electrode 7 that is turned upside down from FIG. 1. As clearly shown in FIG. 6, the external terminal electrode 7 includes a peripheral portion 8 and a center portion 9 surrounded by the peripheral portion 8, the thickness of the peripheral portion 8 is larger than the thickness of the center portion 9, and the peripheral portion 8 is buried in the component main body 3. In the present preferred embodiment, a surface 10 of the external terminal electrode 7 and the principal surface 6 of the component main body 3 are located on the same plane.

The ceramic electronic component 1 further includes the following features regarding the external terminal electrode 7 shown in FIG. 6.

An electrically insulating coating layer 11 is arranged along the principal surface 6 of the component main body 3 so as to cover at least a portion of the peripheral portion 8 of the external terminal electrode 7. An end portion 12 of the coating layer 11 is in contact with a thickest portion of the peripheral portion 8 of the external terminal electrode 7 in the principal surface 6 of the component main body 3. In addition, the coating layer 11 is also located on the same plane as the surface 10 of the external terminal electrode 7.

In addition, a plating film 13 is provided on the surface 10 of the external terminal electrode 7.

The following steps are conducted in order to manufacture such a ceramic electronic component 1.

First, a plurality of ceramic green sheets that are to be the plurality of ceramic layers 2 are prepared. The ceramic green sheets are formed preferably by applying a doctor blade method or the like to a ceramic slurry on a carrier film, for example.

Next, the internal conductor films 4, the via conductors 5, and the external terminal electrodes 7 are formed on the respective specific ceramic green sheets using a conductive paste. The internal conductor films 4 are formed by screen-printing of the conductive paste. The via conductors 5 are formed by irradiating the ceramic green sheets with a laser beam or punching the ceramic green sheets to provide through holes, and filling the conductive paste into the through holes. The forming method of each external terminal electrode 7 will be described later.

For example, a low-temperature co-fired ceramic (LTCC: Low Temperature Co-fired Ceramic) material may be used as a ceramic material included in the above-described ceramic green sheets. For example, the low-temperature sintered ceramic material is a ceramic material that is sinterable at a temperature of about 1050° C. or lower and is sinterable simultaneously with Au, Ag, Cu, etc. having low resistivity. Specific examples of the low-temperature sintered ceramic material include glass composite LTCC materials in which borosilicate glass is mixed with ceramic powder such as alumina, zirconia, magnesia, and forsterite, crystallized glass LTCC materials in which ZnO—MgO—$Al_2O_3$—$SiO_2$ crystallized glass is preferably used, non-glass LTCC materials in which BaO—$Al_2O_3$—$SiO_2$ ceramic powder, $Al_2O_3$—CaO—$SiO_2$—MgO—$B_2O_3$ ceramic powder, etc. are preferably used, etc.

It should be noted that the ceramic material is not limited to the low-temperature sintered ceramic material, and a high-temperature co-fired ceramic (HTCC: High Temperature Co-fired Ceramic) material may be used as the ceramic material. Examples of the high-temperature sintered ceramic material include ceramic materials in which a sintering aid such as glass is added to alumina, aluminum nitride, mullite, or another material and which are sinterable at about 1100° C. or higher, for example. In this case, a metal selected from Mo, Pt, Pd, W, Ni, and alloys containing them among electrically-conductive metal materials included in a conductive paste described later is preferably used.

A metal containing, as a principal component, at least one member of Ag, an Ag—Pt alloy, an Ag—Pd alloy, Cu, Ni, Pt, Pd, W, Mo, and Au may be used as an electrically-conductive metal material included in the conductive paste described above. Among these electrically-conductive metal materials, it is possible to preferably use Ag, the Ag—Pt alloy, the Ag—Pd alloy, and Cu, particularly, in a conductor pattern for high-frequency waves, since they have low resistivity.

Next, the plurality of ceramic green sheets are laminated in a predetermined order and are pressed, such that an unfired component main body 3 is obtained. At that time, the external terminal electrode 7 is located on one of principal surfaces of the component main body 3.

Next, a firing step is conducted to obtain a sintered component main body 3. Here, the internal conductor films 4, the via conductors 5, and the external terminal electrodes 7 are also sintered.

Next, a plating step is conducted to form the plating film 13 on each external terminal electrode 7.

Next, as indicated by an imaginary line in FIG. 1, a surface mount device 14 such as an IC chip or a passive device is mounted on an upper surface of the component main body 3, and a metal cover 15 is mounted on the component main body 3 so as to cover the surface mount device 14. In the present preferred embodiment, the surface mount device 14 is electrically connected directly to end surfaces of the via conductors 5 that are exposed on the upper surface of the component main body 3.

It should be noted that when the above steps are conducted in a state of a mother electronic component from which it is possible to extract a plurality of ceramic electronic components 1, a step of dividing the mother electronic component to extract the individual ceramic electronic components 1 is further conducted.

In the above step of forming each external terminal electrode 7, the thickness of the peripheral portion 8 of the formed external terminal electrode 7 is made larger than the thickness of the center portion 9. Hereinafter, a first preferred embodiment regarding the forming method of the external terminal electrode 7 will be described.

Figure 2A:
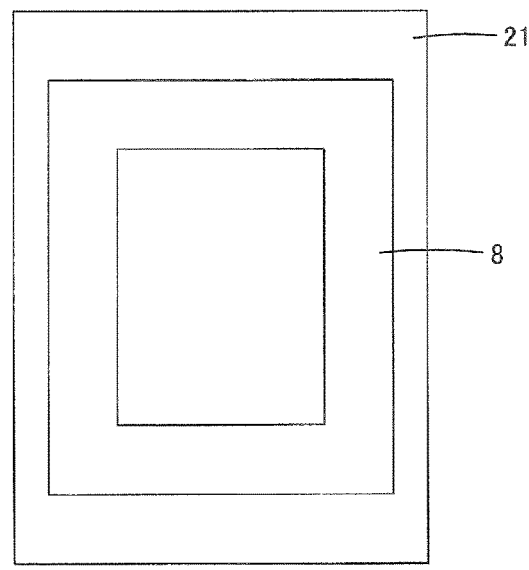
Figure 2B:
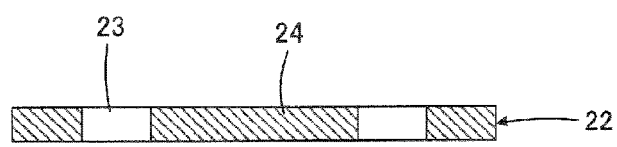
Figure 2B:
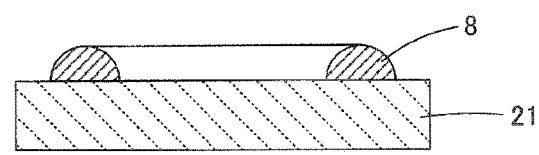

First, as shown in FIGS. 2A and 2B, the peripheral portion 8 of the external terminal electrode 7 is formed on a ceramic green sheet 21 with a relatively large film thickness using a conductive paste. FIG. 2B shows a screen printing plate 22 for printing the peripheral portion 8. The screen printing plate 22 is provided with a transmission portion 23 which allows transmission of the conductive paste, and the other region thereof is formed as a non-transmission portion 24.

As described above, when the peripheral portion 8 is printed by screen printing, adhesiveness between the screen printing plate 22 and the ceramic green sheet 21 is not impaired by the center portion 9, and thus it is possible to obtain favorable printability.

Figure 3A:
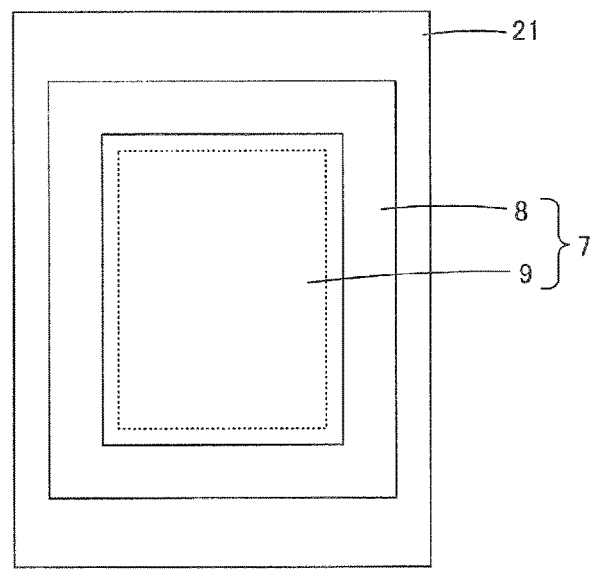
FIGS. 3A and 3B illustrate a step conducted subsequent to a step shown in FIGS. 2A and 2B.
Figure 3B:
Figure 3B:
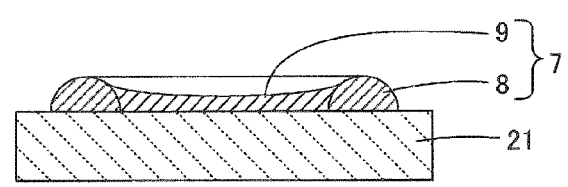

Next, as shown in FIGS. 3A and 3B, the center portion 9 of the external terminal electrode 7 is formed on the ceramic green sheet 21 with a relatively small film thickness using the conductive paste. FIG. 3B shows a screen printing plate 25 for printing the center portion 9. The screen printing plate 25 is provided with a transmission portion 26 which allows transmission of the conductive paste, and the other region thereof is formed as a non-transmission portion 27. It should be noted that the thickness of the screen printing plate 25 is made smaller than the thickness of the screen printing plate 22 in order to form the center portion 9 such that the thickness thereof is smaller than the thickness of the peripheral portion 8.

The center portion 9 shown in FIGS. 3A and 3B is formed so as to overlap a portion of the peripheral portion 8. Thus, even when a slight positional displacement occurs between the peripheral portion 8 and the center portion 9, it is possible to prevent a gap from occurring between the peripheral portion 8 and the center portion 9. If such an advantage is not particularly desired, the center portion 9 may be formed in a state of not overlapping the peripheral portion 8.

Figure 4:
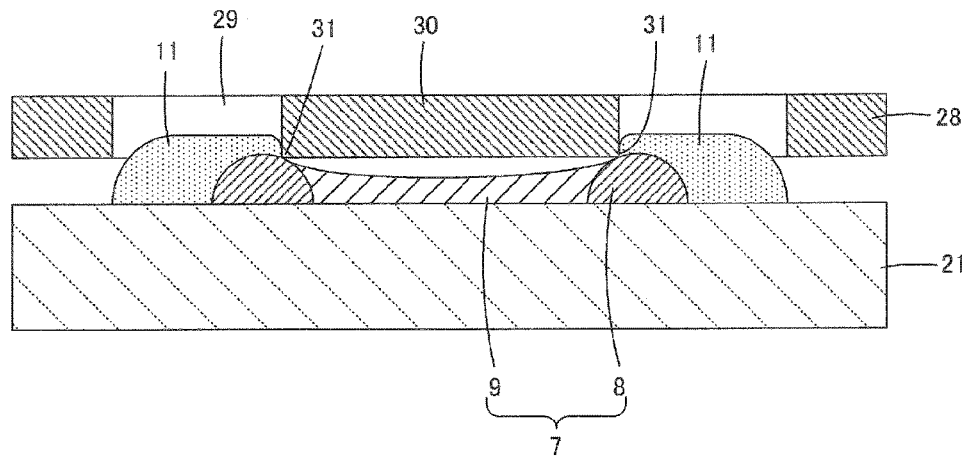
FIG. 4 illustrates a step conducted subsequent to the step shown in FIGS. 3A and 3B and is a cross-sectional view showing, together with a screen printing plate, a state where a coating layer is formed.

Next, as shown in FIG. 4, the electrically insulating coating layer 11 is formed on the ceramic green sheet 21 so as to cover at least a portion of the peripheral portion. The coating layer 11 is formed, for example, by screen-printing of an insulator paste obtained by a pasted ceramic material and/or glass material. FIG. 4 shows a screen printing plate 28 for printing the coating layer 11. The screen printing plate 28 is provided with a transmission portion 29 which allows transmission of the insulator paste, and the other region thereof is formed as a non-transmission portion 30. As is clear from FIG. 4, the thickness of the center portion 9 is smaller than the thickness of the peripheral portion 8, and thus it is possible to easily bring an end edge 31 defining the transmission portion 29 of the screen printing plate 28 into close contact with the peripheral portion 8. Thus, it is possible to form the coating layer 11 with favorable printability, that is, such that no bleeding is caused during printing.

In addition, when the center portion 9 is formed after the peripheral portion 8 is formed; and then the coating layer is formed by screen printing, the peripheral portion 8 is formed with favorable printability as described above. This contributes to making bleeding less likely to occur during screen printing of the coating layer 11.

It should be noted that for forming the coating layer 11, the above printing method is not used, an additionally prepared insulator green sheet is cut out into a desired shape, and the cut-out insulator green sheet may be attached to a predetermined position on the ceramic green sheet 21.

Figure 5:
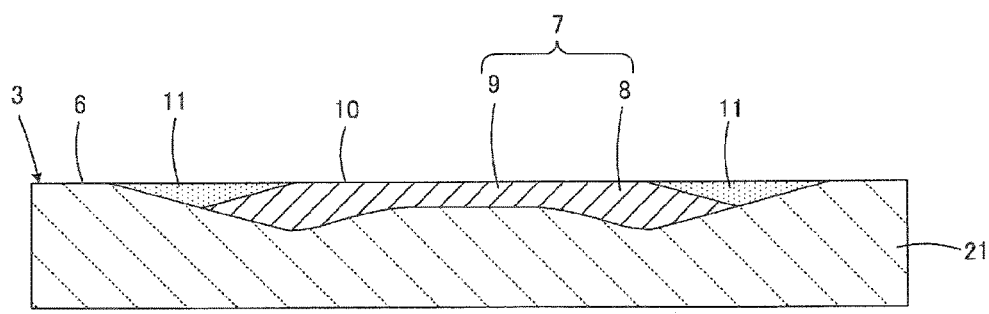
FIG. 5 illustrates a step conducted subsequent to the step shown in FIG. 4 and is a cross-sectional view showing a state after a ceramic green sheet on which the external terminal electrode and the coating layer have been formed is laminated and pressed.

Next, as described above, the plurality of ceramic green sheets including the above ceramic green sheet 21 are laminated in a predetermined order and are pressed. A portion of the unfired component main body 3 obtained through the pressing step is shown in FIG. 5. As a result of the pressing step, not only the adhesiveness between the ceramic green sheet 21 and the external terminal electrode 7 and the coating layer 11 is increased, but also the peripheral portion 8 and the center portion 9 of the external terminal electrode 7 are smoothened such that the surface of the external terminal electrode 7 is located on the same plane as the principal surface of the ceramic green sheet 21, and further the surface of the external terminal electrode 7 and the surface of the coating layer 11 are located on the same plane.

In the above pressing step, both a rigid body press and an elastic body press may be used, and the rigid body press is preferably used in order to achieve a state where the surface of the external terminal electrode 7, the surface of the coating layer 11, and the principal surface of the ceramic green sheet 21 are located on the same plane.

It should be noted that the coating layer 11 preferably is formed only near each external terminal electrode in the ceramic electronic component 1 shown in FIG. 1, but when the interval between the adjacent external terminal electrodes 7 is small, the coating layer 11 may be formed so as to connect between the adjacent external terminal electrodes 7. In addition, the coating layer 11 may be formed over the entirety of the principal surface 6 of the component main body 3.

Next, as described above, the firing step is conducted. As a result, the external terminal electrode 7 and the coating layer 11 are sintered, and the ceramic green sheet 21 is sintered. By the ceramic green sheet 21 being sintered, the ceramic layer 2 shown in FIG. 1 is obtained.

Thereafter, the plating step is conducted, such that the plating film 13 is formed on each external terminal electrode 7 as shown in FIG. 6.

In the ceramic electronic component 1 obtained as described above, the dimension of each portion shown in FIG. 6 is preferably as follows. First, the thickness T1 of the thickest portion of the peripheral portion 8 of each external terminal electrode 7 preferably is about 15 μm to about 40 μm, the depth D of the end portion of the peripheral portion 8 buried by the coating layer 11 preferably is about 5 μm to about 30 μm, and the thickness T2 of the center portion 9 preferably is about 5 μm to about 40 μm, for example. In addition, a ceramic green sheet preferably having a thickness of about 12.5 μm to about 50 μm after sintering is preferably used as the ceramic green sheet 21, for example.

Next, an experimental example conducted for confirming an effect of improving a bonding strength of the external terminal electrode achieved by various preferred embodiments of the present invention will be described.

In the experimental example, samples shown in Table 1 below were produced.

TABLE 1

| | Thickness of external terminal electrode [μm] | | |
| --- | --- | --- | --- |
| Sample number | Center portion | Peripheral portion | Coating layer |
| 1 | 22.9 | 24.1 | None |
| 2 | 22.9 | 24.1 | Present |
| 3 | 18 | 12 | None |
| 4 | 16.1 | 14.9 | None |

As a supplement for a method for producing each sample shown in Table 1, the sample 1 was produced according to the above preferred embodiment, except that no coating layer was formed. The sample 2 was produced according to the above preferred embodiment. The samples 3 and 4 are comparative examples that are outside of the scope of the present invention. In the sample 3, an external terminal electrode was formed by conducting screen printing only once using a relatively thick screen printing plate. In the sample 4, an external terminal electrode was formed by repeating screen printing twice using a relatively thin screen printing plate. In addition, in both of the samples 3 and 4, no coating layer was formed.

For each of the above samples 1 to 4, as shown in Table 2, a bleeding amount during printing of the external terminal electrode was evaluated, and a bonding strength of the external terminal electrode after sintering was evaluated. For the bonding strength, a tensile test was conducted on the external terminal electrode having a plane dimension of 2 mm×2 mm at a tension speed of 0.5 mm/sec, and a tensile strength at the time when peeling occurred was measured, and the average of tensile strengths for 25 samples was obtained.

TABLE 2

| Sample number | Bleeding amount during printing of external terminal electrode [µm] | Bonding strength [N] |
| --- | --- | --- |
| 1 | 8 | 21 |
| 2 | 8 | 40 |
| 3 | 8 | 14 |
| 4 | 22 | 16 |

As is clear from Tables 1 and 2, the bonding strengths of the samples 1 and 2 in which the peripheral portion of the external terminal electrode is thicker than the center portion thereof are increased as compared to the samples 3 and 4. In particular, in the sample 2 in which the coating layer is formed, a higher bonding strength was obtained even as compared to the sample 1.

In contrast, in the samples 3 and 4 in which the peripheral portion of the external terminal electrode is thinner than the center portion thereof, a high bonding strength was not obtained. In addition, in the sample 4, reapplication of the conductive paste for forming the external terminal electrode was conducted, and thus bleeding greatly occurred during printing.

Next, with reference to FIGS. 7A, 7B, 8A and 8B, a second preferred embodiment regarding the forming method of the external terminal electrode 7 will be described. Briefly speaking, the second preferred embodiment is characterized in that the order of forming the peripheral portion 8 and the center portion 9 is reverse to that in the first preferred embodiment.

Figure 7A:
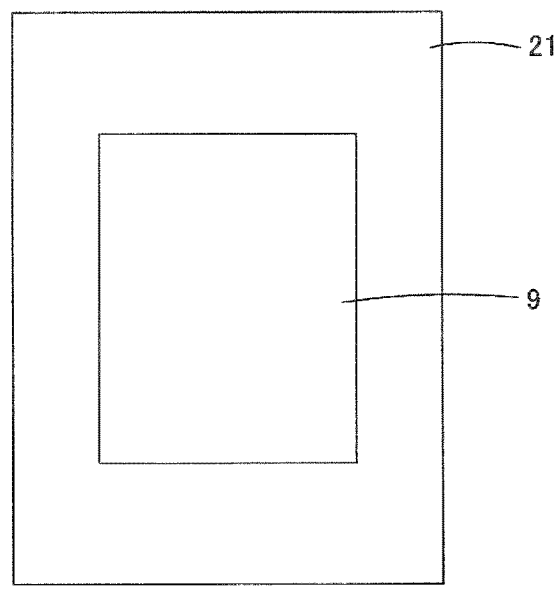
Figure 7B:
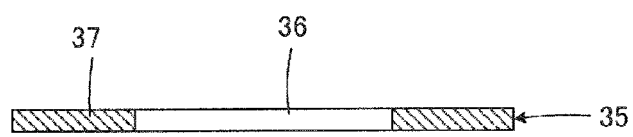
Figure 7B:
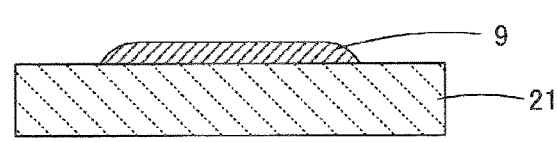

First, as shown in FIGS. 7A and 7B, the center portion 9 of the external terminal electrode 7 is formed on the ceramic green sheet 21 with a relatively small film thickness using a conductive paste. FIG. 7B shows a screen printing plate 35 for printing the center portion 9. The screen printing plate 35 is provided with a transmission portion 36 which allows transmission of the conductive paste, and the other region thereof is formed as a non-transmission portion 37.

As described above, when the center portion 9 is formed before the peripheral portion 8 is formed, it is easy to form the center portion 9 such that the center portion 9 is thin.

Figure 8A:
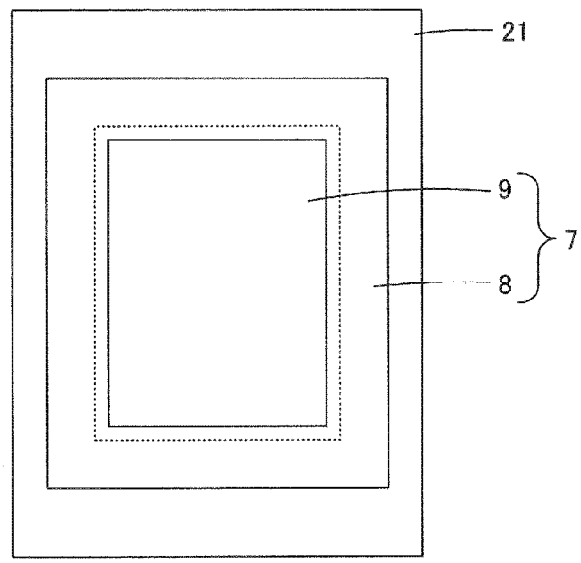
Figure 8B:
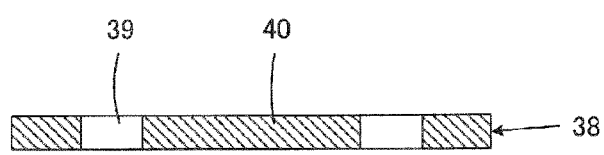
Figure 8B:
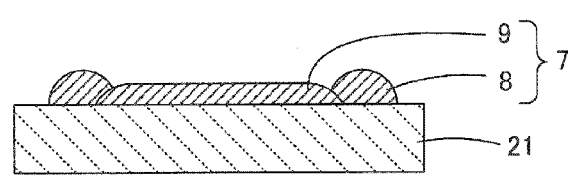

Next, as shown in FIGS. 8A and 8B, the peripheral portion 8 of the external terminal electrode 7 is formed on the ceramic green sheet 21 with a relatively large film thickness using a conductive paste. FIG. 8B shows a screen printing plate 38 for printing the peripheral portion 8. The screen printing plate 38 is provided with a transmission portion 39 which allows transmission of the conductive paste, and the other region thereof is formed as a non-transmission portion 40. It should be noted that in order to form the peripheral portion 8 such that the thickness thereof is larger than the thickness of the center portion 9, for example, the thickness of the screen printing plate 38 is made larger than the thickness of the screen printing plate 35.

The peripheral portion 8 shown in FIGS. 8A and 8B is formed so as to overlap a portion of the center portion 9, but may be formed in a state of not overlapping the center portion 9. In addition, the peripheral portion 8 may be formed in a state where the entirety thereof overlaps the center portion 9, that is, in a state where the entirety thereof is located on the center portion 9.

Thereafter, similarly to the case of the above preferred embodiment, a step of forming the coating layer 11, a step of laminating a plurality of ceramic green sheets, a pressing step, a firing step, and a plating step are sequentially conducted, and the ceramic electronic component 1 shown in FIG. 1 is obtained.

As in the second preferred embodiment, when the peripheral portion 8 is formed after the center portion 9; and then the coating layer 11 is formed by screen printing, it is possible to form the center portion 9 such that the center portion 9 is thinner as described above. Thus, it is easy to further increase the difference in thickness between the thicker peripheral portion 8 and the thinner center portion 9, and it is possible to increase the adhesiveness between the peripheral portion 8 and the screen printing plate for printing the coating layer 11. Therefore, it is possible to make bleeding less likely to occur during screen printing of the coating layer 11.

In the above-described first and second preferred embodiments regarding the forming method of the external terminal electrode 7, the amount of an organic solvent in the conductive paste for forming the peripheral portion 8 may be made different from that in the conductive paste for forming the center portion 9. In other words, when the amount of the organic solvent included in the conductive paste for the peripheral portion 8 is smaller than the amount of the organic solvent included in the conductive paste for the center portion 9, it is made easy to print the peripheral portion 8 such that the peripheral portion 8 is thicker, and it is made easy to print the center portion 9 such that the center portion 9 is thinner.

In addition, when the amount of an inorganic material contained in the conductive paste for the peripheral portion 8 is made different from that in the conductive paste for the center portion 9, the following advantages are provided. Specifically, when the amount of the inorganic material such as glass or an inorganic oxide ($Al_2O_3$, $ZrO_2$, $MnO_2$, etc.) in the conductive paste for forming the peripheral portion 8 is larger than that in the conductive paste for forming the center portion 9, the inorganic material is firmly bonded to the glass component included in the ceramic material in the ceramic green sheet 21 by firing, and thus it is possible to improve a bonding strength particularly at the peripheral portion 8. Meanwhile, when the inorganic material is added in a large amount, a conductor film obtained by firing is not compact, and infiltration of water from the outside easily occurs. Therefore, when the amount of the inorganic material in the conductive paste for forming the center portion 9 is relatively small, a compact conductor film is formed at the center portion 9. In particular, as is clear from FIG. 1, the center portion 9 is formed so as to be relatively thin and is connected to the via conductor 5 within the component main body 3, and thus is preferably a compact conductor film.

It should be noted that the above inorganic material may be added to the conductive paste in the form of inorganic material powder, or may be added thereto in a state of coating the particle surface of metal powder, for example.

Figure 9:
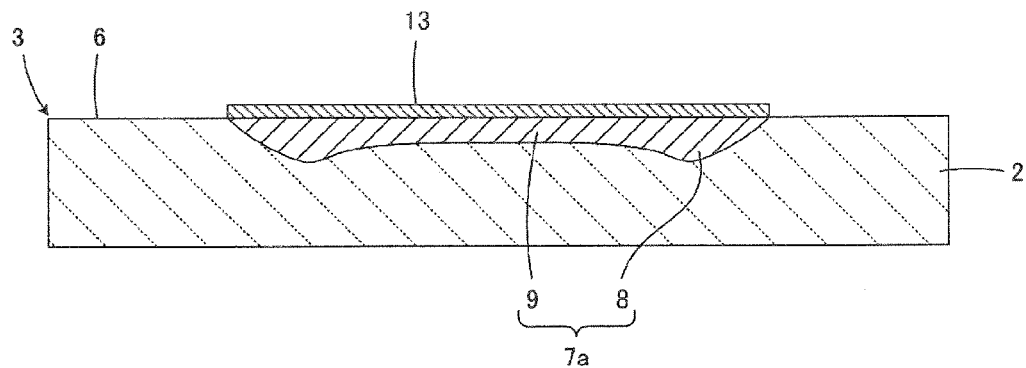
FIG. 9 is a cross-sectional view showing a first modification of a formed state of the external terminal electrode.
Figure 10:
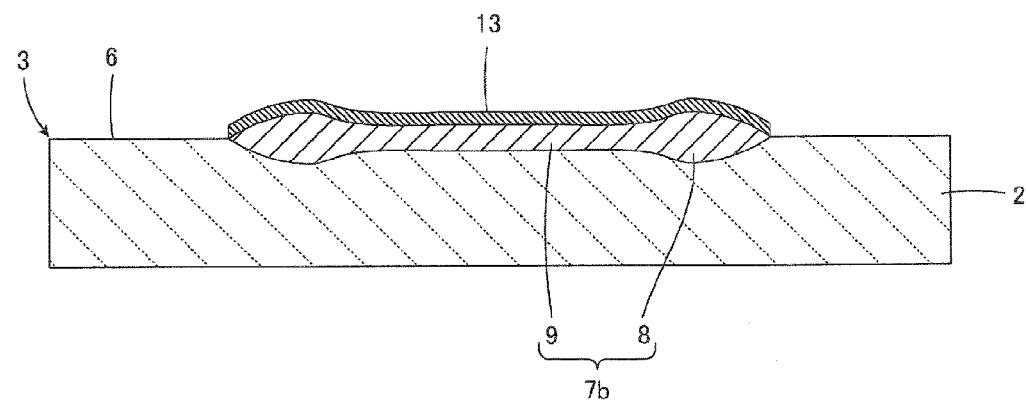
FIG. 10 is a cross-sectional view showing a second modification of the formed state of the external terminal electrode.

Next, modifications of the formed state of the external terminal electrode will be described with reference to FIGS. 9 and 10. FIGS. 9 and 10 are diagrams corresponding to FIG. 6. In FIGS. 9 and 10, elements corresponding to elements shown in FIG. 6 are designated at the same reference signs, and the overlap description is omitted.

An external terminal electrode 7a shown in FIG. 9 is characterized in that a coating layer covering at least a portion of its peripheral portion 8 is not formed.

An external terminal electrode 7b shown in FIG. 10 is characterized in that a coating layer covering at least a portion of its peripheral portion 8 is not formed and only a portion of the peripheral portion 8 is buried in the component main body 3.

Figure 11:
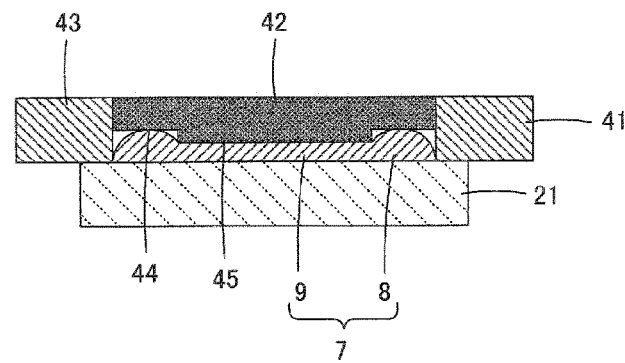
FIG. 11 illustrates a third preferred embodiment regarding the forming method of the external terminal electrode provided in the ceramic electronic component shown in FIG. 1 and is a cross-sectional view showing a formed external terminal electrode together with a screen printing plate.

Next, a third preferred embodiment regarding the forming method of the external terminal electrode will be described with reference to FIG. 11. Briefly speaking, the third preferred embodiment is characterized in that the peripheral portion 8 and the center portion 9 of the external terminal electrode 7 are formed simultaneously.

A screen printing plate 41 used in the present preferred embodiment is provided with a transmission portion 42 which allows transmission of a conductive paste and a non-transmission portion 43 which inhibits transmission of the conductive paste. In the region of the transmission portion 42, its center portion 45 is thicker than its peripheral portion 44, and the transmission portion 42 is shaped such that the center portion 45 projects downward.

Since such a screen printing plate 41 is used, it is possible to form the external terminal electrode 7 in which the thickness of the peripheral portion 8 is larger than the thickness of the center portion 9, by conducting screen printing once.

Although the present invention has been described above in connection with the illustrated preferred embodiments, it is possible to make other various modifications within the scope of the present invention.

For example, in the above preferred embodiments, the external terminal electrode and the coating layer are formed on the ceramic green sheet that has not been laminated, but may be formed on the ceramic green sheet that is located at the outermost surface of an unfired component main body obtained by laminating a plurality of ceramic green sheets.

In addition, preferred embodiments of the present invention are applicable to not only a ceramic electronic component including a component main body having a laminated structure but also a ceramic electronic component including a component main body composed of a single ceramic layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   a component main body; and
   a conductive external terminal electrode provided along a principal surface of the component main body such that the ceramic electronic component is capable of being mounted on a mounting board with the conductive external terminal electrode electrically connected to the mounting board; wherein
   the conductive external terminal electrode includes a peripheral portion and a center portion surrounded by the peripheral portion, the peripheral portion includes a first portion and a second portion that is disposed further from the center portion in a direction along the principal surface of the component main body than the first portion, a thickness of the first portion is larger than a thickness of the center portion, a thickness of the second portion is smaller than a thickness of the first portion, and at least a portion of the peripheral portion is buried in the component main body;
   the thickness of the center portion, the thickness of the first portion, and the thickness of the second portion are thicknesses of the conductive external terminal electrode in a direction that is perpendicular to the principal surface of the component main body;
   the peripheral portion of the conductive external terminal electrode includes a first surface that is closest to the principal surface of the component main body and a second surface that is opposite to the first surface;
   from a thickest portion of the peripheral portion of the conductive external terminal electrode towards an end portion of the peripheral portion of the conductive external terminal electrode, a distance between the principal surface of the component main body and the second surface of the peripheral portion decreases continuously along an entire portion of the conductive external terminal electrode from the thickest portion to the end portion; and
   the ceramic electronic component further comprises an electrically insulating coating layer arranged along the principal surface of the component main body so as to cover at least a portion of the peripheral portion of the conductive external terminal electrode.

2. The ceramic electronic component according to claim 1, wherein a surface of the conductive external terminal electrode and the principal surface of the component main body are located on a same plane.

3. The ceramic electronic component according to claim 1, wherein an end portion of the coating layer is in contact with the thickest portion of the peripheral portion of the conductive external terminal electrode in the principal surface of the component main body.

4. The ceramic electronic component according to claim 1, wherein the coating layer and a surface of the conductive external terminal electrode are located on a same plane.

5. The ceramic electronic component according to claim 1, further comprising a plating film located on a surface of the conductive external terminal electrode.

6. The ceramic electronic component according to claim 1, wherein the center portion and the peripheral portion of the conductive external terminal electrode have compositions different from each other.

7. The ceramic electronic component according to claim 1, wherein
   the component main body includes a plurality of laminated ceramic layers; and the ceramic electronic component further comprises an internal conductor disposed within the component main body.

8. The ceramic electronic component according to claim 1, wherein an end portion of the electrically insulating coating layer is in contact with the thickest portion of the peripheral portion of the conductive external terminal electrode in the principal surface of the component main body or the electrically insulating coating layer is on a same plane as a surface of the conductive external terminal electrode.

* * * * *